United States Patent
Ma et al.

(10) Patent No.: US 11,380,873 B2
(45) Date of Patent: Jul. 5, 2022

(54) DISPLAY PANEL AND ELECTRONIC DEVICE INCLUDING TOUGH LAYER WITH RECESSED PORTIONS

(71) Applicant: Wuhan China Star Optoelectronics Semiconductor Display Technology Co., Ltd., Wuhan (CN)

(72) Inventors: Weixin Ma, Wuhan (CN); Caiqin Chen, Wuhan (CN); Yu Zhao, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 217 days.

(21) Appl. No.: 16/768,935

(22) PCT Filed: Nov. 11, 2019

(86) PCT No.: PCT/CN2019/117040
§ 371 (c)(1),
(2) Date: Jun. 2, 2020

(87) PCT Pub. No.: WO2021/042520
PCT Pub. Date: Mar. 11, 2021

(65) Prior Publication Data
US 2021/0408486 A1    Dec. 30, 2021

(30) Foreign Application Priority Data

Sep. 6, 2019    (CN) .......................... 201910839669.2

(51) Int. Cl.
*H01L 51/52* (2006.01)
*H01L 27/32* (2006.01)
*H01L 27/14* (2006.01)
*G06F 3/041* (2006.01)
*H01L 27/146* (2006.01)

(52) U.S. Cl.
CPC ........ *H01L 51/5262* (2013.01); *G06F 3/0412* (2013.01); *H01L 27/323* (2013.01);
(Continued)

(58) Field of Classification Search
CPC ............. H01L 51/5262; H01L 51/5253; H01L 51/5271; H01L 2251/301; H01L 27/323;
(Continued)

(56) References Cited

U.S. PATENT DOCUMENTS 6,037,712 A * 3/2000 Codama .............. H01L 27/3283
428/917
10,950,674 B2 * 3/2021 Ouyang .............. H01L 27/3234
(Continued)

FOREIGN PATENT DOCUMENTS

CN    106293197    1/2017
CN    106654041    5/2017
(Continued)

*Primary Examiner* — Ida M Soward

(57) ABSTRACT

A display panel and an electronic device are disclosed. The display panel includes a light-emitting layer, an encapsulation layer, and a touch layer. The light-emitting layer includes a plurality of pixel units and a plurality of isolating units disposed among the pixel units. The touch layer includes at least an insulating dielectric layer covering the encapsulation layer, and a plurality of touch units. The touch layer further includes a plurality of recessed portions disposed on the insulting dielectric layer and corresponding to the pixel units.

18 Claims, 3 Drawing Sheets

(52) U.S. Cl.
CPC ...... *H01L 27/14678* (2013.01); *H01L 27/326* (2013.01); *H01L 27/3216* (2013.01); *H01L 27/3218* (2013.01); *H01L 51/5253* (2013.01); *H01L 2251/301* (2013.01)

(58) Field of Classification Search
CPC ............... H01L 27/3211; H01L 27/326; H01L 27/14678; H01L 27/3216; H01L 27/3218; G06F 3/0412; G06F 3/0416
See application file for complete search history.

(56) References Cited

U.S. PATENT DOCUMENTS

| | | | |
|---|---|---|---|
| 2011/0242027 | A1 | 10/2011 | Chang |
| 2016/0378224 | A1* | 12/2016 | Kwon ................. H01L 51/5256 345/174 |
| 2017/0308196 | A1 | 10/2017 | Jeong et al. |
| 2018/0166476 | A1* | 6/2018 | Chen ................. H01L 27/14687 |
| 2019/0129541 | A1 | 5/2019 | Kwon et al. |
| 2019/0206945 | A1 | 7/2019 | Lin et al. |
| 2021/0208715 | A1* | 7/2021 | Yang ................. H01L 51/5221 |

FOREIGN PATENT DOCUMENTS

| | | |
|---|---|---|
| CN | 107219956 | 9/2017 |
| CN | 107247368 | 10/2017 |
| CN | 107919380 | 4/2018 |
| CN | 108493211 | 9/2018 |
| CN | 109004004 | 12/2018 |
| CN | 110165085 | 8/2019 |

* cited by examiner

DISPLAY PANEL AND ELECTRONIC DEVICE INCLUDING TOUGH LAYER WITH RECESSED PORTIONS

RELATED APPLICATIONS

This application is a National Phase of PCT Patent Application No. PCT/CN2019/117040 having International filing date of Nov. 11, 2019, which claims the benefit of priority of Chinese Patent Application No. 201910839669.2 filed on Sep. 6, 2019. The contents of the above applications are all incorporated by reference as if fully set forth herein in their entirety.

FIELD AND BACKGROUND OF THE INVENTION

The present invention relates to a technical field of electronic displays, and particularly to, a display panel and an electronic device.

In order to further reduce thickness of electronic devices, direct on cell touch (DOT) structures are often used in the prior art to form electronic devices with touch functions. Taking organic light-emitting diode (OLED) display panels as an example, touch structures are fabricated directly on encapsulation structures. Since DOT processes are completed directly on OLED encapsulation films, they are more resistant to bending than OLED panels with touch-control structures.

Please refer to FIG. 1 showing a schematic structural view of a conventional organic light-emitting diode (OLED) panel configured with a direct on cell touch (DOT) structure. In the prior art, a DOT structure located above the OLED panel includes at least two insulating dielectric layers 500 for achieving electrical insulation. The insulating dielectric layers 500 are generally made of a transparent resin material or rubber material. Although the insulating dielectric layers 500 are made of a transparent material, a relatively greater thickness of the insulating dielectric layers 500 also brings about a certain light shielding effect, thereby adversely affecting light transmittance of a display panel.

SUMMARY OF THE INVENTION

The present application provides a display panel and an electronic device to improve light transmittance of an organic light-emitting diode (OLED) panel configured with a direct on cell touch (DOT) structure.

In order to overcome the above-mentioned problem, the present application provides a display panel, comprising a light-emitting layer comprising a plurality of pixel units and a plurality of isolating units disposed among the pixel units; an encapsulation layer covering the light-emitting layer; and a touch layer comprising at least an insulating dielectric layer covering the encapsulation layer, and a plurality of touch units disposed in the insulating dielectric layer, wherein the plurality of touch units are disposed over the isolating units; wherein the touch layer further comprises a plurality of recessed portions disposed on the insulting dielectric layer and corresponding to the plurality of pixel units.

In one aspect of the present application, each of the touch units is projected on the light-emitting layer at positions corresponding to the isolating units, and each of the recessed portions is disposed on a corresponding one of the pixel units.

In one aspect of the present application, each of the recessed portions has a trapezoidal cross section in a direction perpendicular to a surface of the display panel from which light is emitted, wherein a side of the trapezoidal cross section adjacent to the light-emitting layer has a length less than that of another side of the trapezoidal cross section away from the light-emitting layer.

In one aspect of the present application, a juncture of each of the recessed portions and the insulating dielectric layer is configured with a smooth mirror surface structure.

In one aspect of the present application, the touch layer comprises a first insulating dielectric layer disposed on the encapsulation layer; a first metal layer disposed on the first insulating dielectric layer; a second insulating dielectric layer covering the first metal layer and the first insulating dielectric layer; a second metal layer disposed on the second insulting dielectric layer and electrically connected to the first metal layer through a plurality of via holes; and a third insulating dielectric layer covering the second metal layer and the second insulating dielectric layer.

In one aspect of the present application, the second metal layer is configured with a plurality of hollow annular structures or a plurality of frame structures, wherein each of the annular structures or the frame structures has a metal portion disposed over the isolating units, and each of the annular structures or the frame structures has a hollow portion disposed over the pixel units.

In one aspect of the present application, the first metal layer comprises a plurality of metal strips, and each of the metal strips is disposed below adjacent two of the annular structures or the frame structures corresponding to the metal strip, and is electrically connected to the annular structures or the frame structures through the via holes.

In one aspect of the present application, each of the recessed portions passes through the first insulating dielectric layer, the second insulating dielectric layer, and the third insulating dielectric layer, and exposes a surface of the encapsulation layer.

In one aspect of the present application, ach of the recessed portions has a first opening passing through the first insulating dielectric layer and the second insulating dielectric layer, wherein the first opening exposes a surface of the encapsulation layer, and the third insulating dielectric layer covers the first opening.

In one aspect of the present application, the display panel further includes a glass cover, wherein the glass cover covers the touch layer.

The present application further provides an electronic device, comprising a display panel, wherein the display panel comprises a light-emitting layer comprising a plurality of pixel units and a plurality of isolating units disposed among the pixel units; an encapsulation layer covering the light-emitting layer; and a touch layer comprising at least an insulating dielectric layer covering the encapsulation layer, and a plurality of touch units disposed in the insulating dielectric layer, wherein the plurality of touch units are disposed over the isolating units; wherein the touch layer further comprises a plurality of recessed portions disposed on the insulting dielectric layer and corresponding to the plurality of pixel units.

In one aspect of the present application, each of the touch units has a projection located on a corresponding one of the isolating units of the light-emitting layer, and each of the recessed portions is disposed on a corresponding one of the pixel units.

In one aspect of the present application, each of the touch units is projected on the light-emitting layer at positions corresponding to the isolating units, and each of the recessed portions is disposed on a corresponding one of the pixel units.

In one aspect of the present application, a juncture of each of the recessed portions and the insulating dielectric layer is configured with a smooth mirror surface structure.

In one aspect of the present application, the touch layer comprises a first insulating dielectric layer disposed on the encapsulation layer; a first metal layer disposed on the first insulating dielectric layer; a second insulating dielectric layer covering the first metal layer and the first insulating dielectric layer; a second metal layer disposed on the second insulting dielectric layer and electrically connected to the first metal layer through a plurality of via holes; and a third insulating dielectric layer covering the second metal layer and the second insulating dielectric layer.

In one aspect of the present application, the second metal layer is configured with a plurality of hollow annular structures or a plurality of frame structures, wherein each of the annular structures or the frame structures has a metal portion disposed over the isolating units, and each of the annular structures or the frame structures has a hollow portion disposed over the pixel units.

In one aspect of the present application, the first metal layer comprises a plurality of metal strips, and each of the metal strips is disposed below adjacent two of the annular structures or the frame structures corresponding to the metal strip, and is electrically connected to the annular structures or the frame structures through the via holes.

In one aspect of the present application, each of the recessed portions passes through the first insulating dielectric layer, the second insulating dielectric layer, and the third insulating dielectric layer, and exposes a surface of the encapsulation layer.

In one aspect of the present application, each of the recessed portions has a first opening passing through the first insulating dielectric layer and the second insulating dielectric layer, wherein the first opening exposes a surface of the encapsulation layer, and the third insulating dielectric layer covers the first opening.

In one aspect of the present application, the display panel further includes a glass cover, wherein the glass cover covers the touch layer.

The present application is directed to improve an OLED panel with a DOT structure. A plurality of recessed portions are disposed on an insulating dielectric layer among a plurality of touch units of a touch layer, and the recessed portions are exposed to a plurality of pixel units of the display panel, thereby avoiding light emitted by the pixel units being absorbed and refracted by the insulating dielectric layer, and significantly enhancing light transmittance of the OLED panel with the DOT structure.

DESCRIPTION OF SPECIFIC EMBODIMENTS OF THE INVENTION

The following embodiments are referring to the accompanying drawings for exemplifying specific implementable embodiments of the present invention. Directional terms described by the present invention, such as upper, lower, front, back, left, right, inner, outer, side, etc., are only directions by referring to the accompanying drawings, and thus the used directional terms are used to describe and understand the present invention, but the present invention is not limited thereto.

Figure 1:
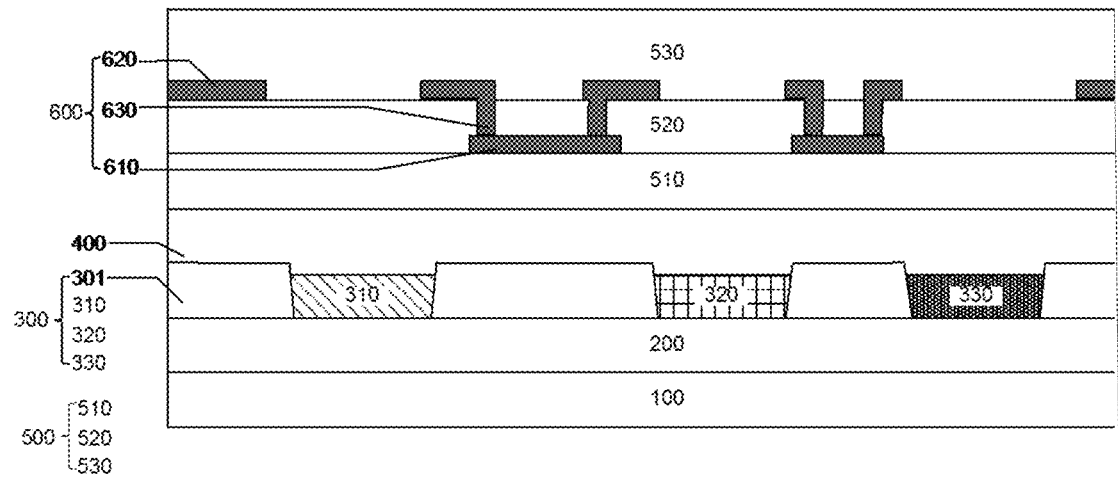
FIG. 1 is a schematic structural view of a conventional organic light-emitting diode (OLED) panel configured with a direct on cell touch (DOT) structure.
Figure 2:
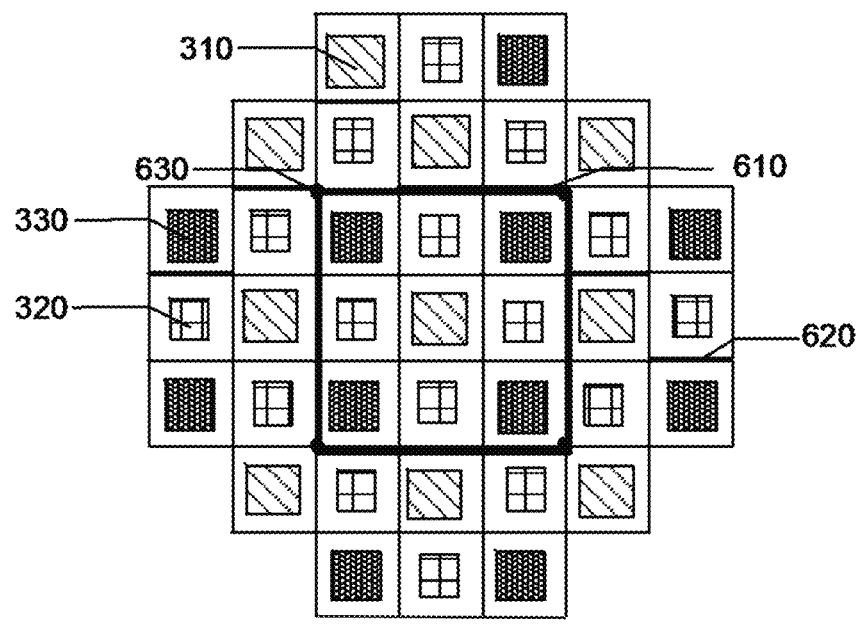
FIG. 2 is a partial top plan view of the OLED panel of FIG. 1.

First, the prior art is briefly described below. Please refer to FIGS. 1 and 2. FIG. 1 is a schematic structural view of a conventional organic light-emitting diode (OLED) panel configured with a direct on cell touch (DOT) structure. FIG. 2 is a partial top plan view of the OLED panel of FIG. 1. The display panel includes a substrate 100, a thin-film transistor layer 200, a light-emitting layer 300, an encapsulation layer 400, and a touch layer. The light-emitting layer includes a plurality of first pixel units 310, a plurality of second pixel units 320, and a plurality of third pixel units 330. A plurality of isolating units 301 are disposed among the plurality of first pixel units 310, the plurality of second pixel units 320, and the plurality of third pixel units 330.

The touch layer includes at least an insulating dielectric layer 500 and a plurality of touch units 600 disposed in the insulating dielectric layer. The touch units 600 are disposed over the isolating units 301. In the prior art, the insulating dielectric layers 500 are generally made of a transparent resin material or rubber material. Although the insulating dielectric layers 500 are made of a transparent material, a relatively greater thickness of the insulating dielectric layers 500 also brings about a certain light shielding effect, thereby adversely affecting light transmittance of a display panel.

As a result, the present application provides a display panel and an electronic device to improve light transmittance of an organic light-emitting diode (OLED) panel configured with a direct on cell touch (DOT) structure.

Figure 3:
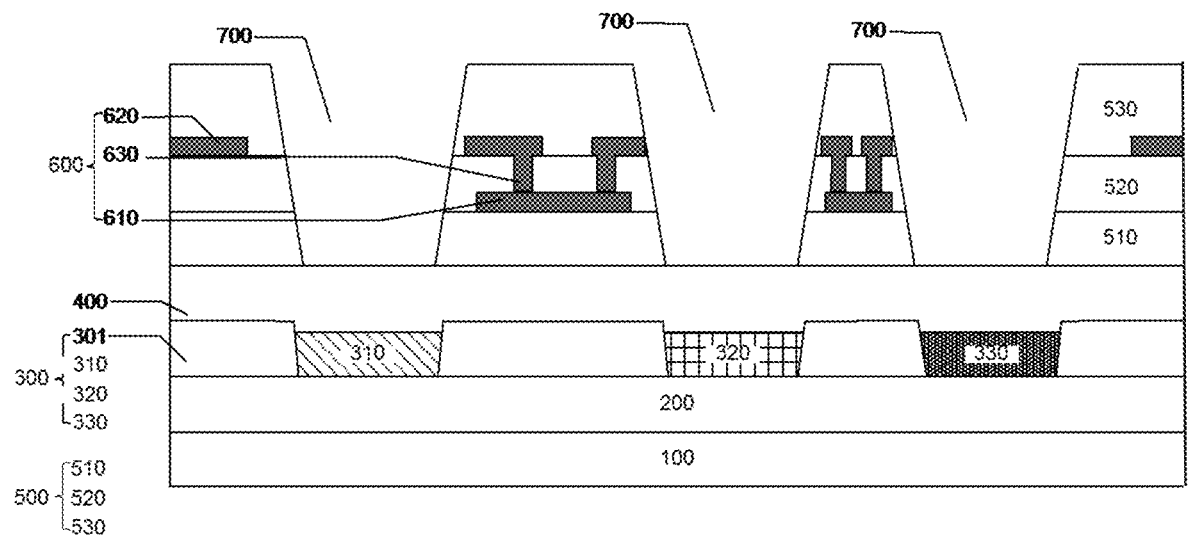
FIG. 3 is a schematic structural view of an OLED panel configured with a DOT structure of an embodiment of the present application.
Figure 4:
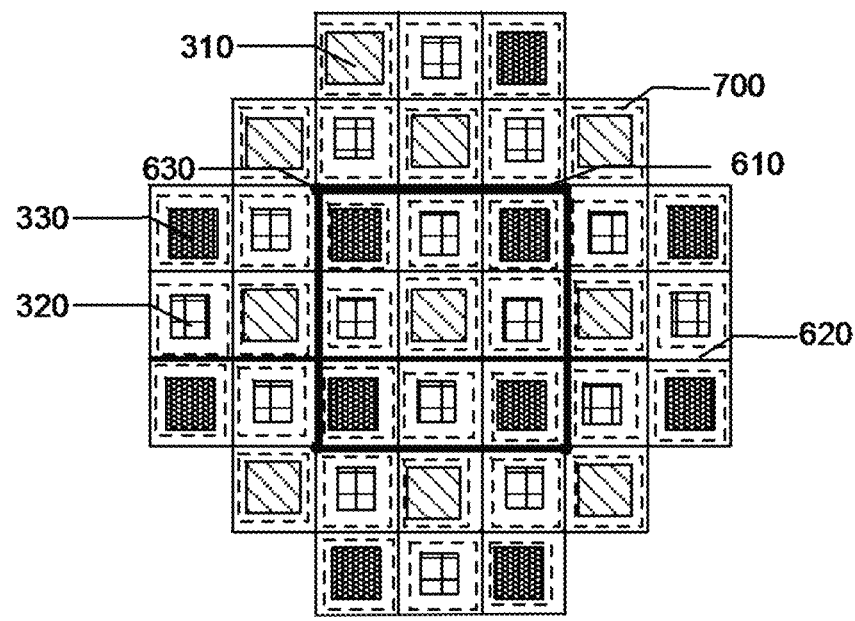
FIG. 4 is a partial top plan view of the OLED panel of FIG. 3.

Please refer to FIGS. 3 and 4. FIG. 3 is a schematic structural view of an OLED panel configured with a DOT structure of an embodiment of the present application. FIG. 4 is a partial top plan view of the OLED panel of FIG. 3. The display panel includes a light-emitting layer 300, an encapsulation layer 400, and a touch layer.

The light-emitting layer 300 includes a plurality of pixel units and a plurality of isolating units 301 disposed among the pixel units. The plurality of pixel units include a plurality of red pixel units 310, a plurality of blue pixel units 320, and a plurality of green pixel units 330. The plurality of red pixel units 310, the plurality of blue pixel units 320, and the plurality of green pixel units 330 are equal in number and are spaced apart from one another. Any adjacent two of the pixel units are separated by a corresponding one of the isolating units 301.

The encapsulation layer 400 covers the light-emitting layer 300. In this embodiment, the encapsulation layer 400 is a thin-film encapsulation structure. The thin-film encapsulation structure generally includes a plurality of organic films laminated to each other and a plurality of inorganic films. A surface of the thin-film encapsulation structure is an organic encapsulation film, such as zinc oxide or other inorganic oxides.

The touch layer includes at least an insulating dielectric layer 500 covering the encapsulation layer 400, and a plurality of touch units 600 disposed in the insulating dielectric layer 500. The plurality of touch units 600 are disposed over the isolating units 301.

In this embodiment, the insulating dielectric layer 500 includes a first insulating dielectric layer 510, a second insulating dielectric layer 520, and a third insulating dielectric layer 530. The touch units 600 include a first metal layer 610 and a second metal layer 620.

The first insulating dielectric layer 510 is disposed on the encapsulation layer 400 to function as a buffer layer between the encapsulation layer 400 and the touch layer. The first metal layer 610 is disposed on the first insulating dielectric layer 510. The second insulating dielectric layer 520 covers the first metal layer 610 and the first insulating dielectric layer 510. The second metal layer 620 is disposed on the second insulting dielectric layer 520 and is electrically connected to the first metal layer 610 through a plurality of via holes 630. The third insulating dielectric layer 530 covers the second metal layer 620 and the second insulating dielectric layer 520.

The touch layer further includes a plurality of recessed portions 700 disposed on the insulting dielectric layer 500. The recessed portions 700 are disposed on the red pixel units 310, the blue pixel units 320, and the green pixel units 330.

In this embodiment, the touch units 600 are disposed corresponding to the red pixel units 310, the blue pixel units 320, and the green pixel units 330. Each of the touch units 600 is projected on the light-emitting layer 300 at positions corresponding the isolating units 301. The recessed portions 700 are disposed corresponding to the pixel units. Each of the recessed portions 700 is projected on the light-emitting layer 300 at a position covering a corresponding one of the pixel units.

Please refer to FIG. 3. In this embodiment, each of the recessed portions 700 has a trapezoidal cross section in a direction perpendicular to a surface of the display panel from which light is emitted. A bottom of the trapezoidal cross section adjacent to the light-emitting layer 300 has a length less than that of another bottom of the trapezoidal cross section away from the light-emitting layer 300. A juncture of each of the recessed portions 700 and the insulating dielectric layer 500 is configured with a smooth mirror surface structure.

In this embodiment, a selective etching process is performed on the first insulating dielectric layer 510, the second insulating dielectric layer 520, and the third insulating dielectric layer 530 after they are being formed, so that the recessed portions 700 are formed to pass through the first insulating dielectric layer 510, the second insulating dielectric layer 520, and the third insulating dielectric layer 530. The recessed portions 700 expose a surface of the encapsulation layer 400.

Because the bottoms of the recessed portions 700 completely shield the pixel units located below the recessed portions 700, and the recessed portions 700 each have a recessed shape having an upper side greater than a lower side, light emitted by the pixel units corresponding to the recessed portions 700 can be emitted outside without being blocked by the recessed portions 700. Since the light does not pass through the insulating dielectric layer in the touch layer, the present application avoids the light emitted by the pixel units being absorbed and refracted by the insulating dielectric layer, thereby preventing light loss, and enhancing light transmittance of the display panel. Furthermore, since side walls of each of the recessed portions 700 are a smooth mirror surface structure, light rays directed to the side walls of the recessed portions 700 can be reflected and emitted from the recessed portions 700.

Figure 5:
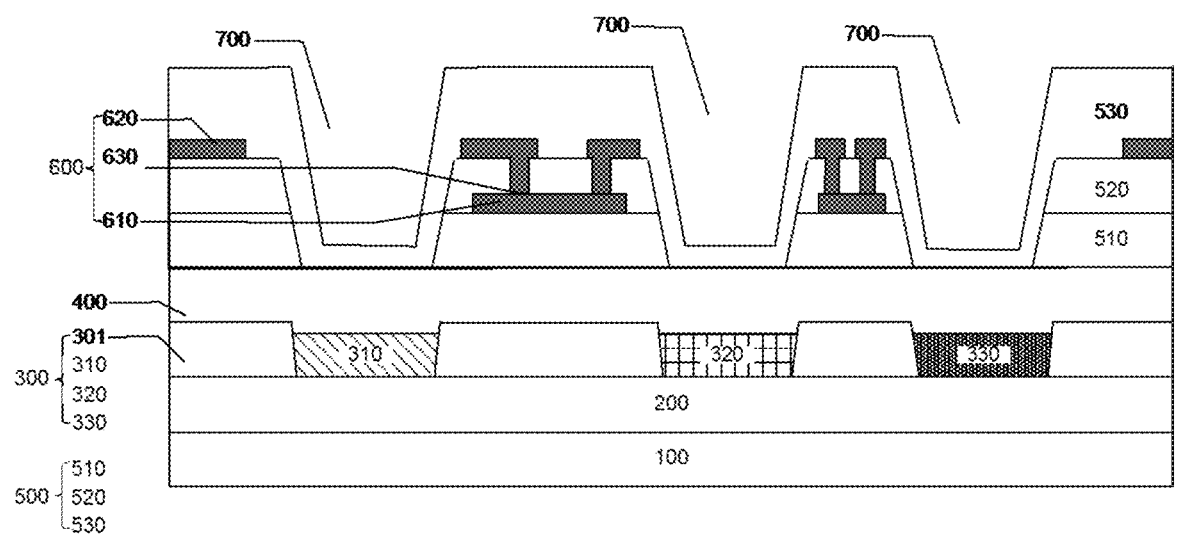
FIG. 5 is a schematic structural view of an OLED panel configured with a DOT structure of another embodiment of the present application.

Please refer to FIG. 5 showing another embodiment of the present application. In this embodiment, a selective etching process is performed on the first insulating dielectric layer 510 and the second insulating dielectric layer 520 after they are formed, thereby to form a first opening passing through the first insulating dielectric layer 510 and the second insulating dielectric layer 520. The first opening exposes a surface of the encapsulation layer 400. Then, a third insulting dielectric layer 530 is formed to cover the second insulating dielectric layer 520 and the first opening. The third insulating dielectric layer 530 disposed on the first opening covers a surface of the encapsulation layer 400. In this embodiment, the third insulating dielectric layer 530 covers the first opening and the surface of the encapsulation layer 400, thereby forming a sealing layer covering a touch structure. The sealing layer functions to prevent moisture and oxygen from entering inside of the touch layer, thereby to improve stability of the touch layer and to extend a service life of the touch layer.

Please refer to FIG. 4. The second metal layer 620 is configured with a plurality of hollow annular structures or frame structures. Each of the annular structures or the frame structures has a metal portion disposed over the isolating units 301, and each of the annular structures or the frame structures has a hollow portion disposed over the pixel units.

In this embodiment, referring to FIG. 4, the first metal layer 610 includes a plurality of metal strips, and each of the metal strips is disposed below adjacent two of the annular structures or the frame structures corresponding to the metal strip, and is electrically connected to the annular structures or the frame structures through the via holes 630. Please refer to FIGS. 3 and 4, each of the first metal layer 610 and the second metal layer 620 is projected on the light-emitting layer 300 at positions corresponding to the isolating units 310, not overlapped with the pixel units.

In the preset application, the display panel further includes a glass cover, wherein the glass cover covers the touch layer.

Furthermore, the present application provides an electronic device including the display panel as described in the above embodiments.

The present application is directed to improve an OLED panel with a DOT structure. A plurality of recessed portions are disposed on an insulating dielectric layer between a plurality of touch units of a touch layer, and the recessed portions are exposed to a plurality of pixel units of the display panel, thereby avoiding light emitted by the pixel units being absorbed and refracted by the insulating dielectric layer, and significantly enhancing light transmittance of the OLED panel with the DOT structure.

Accordingly, although the present invention has been disclosed as a preferred embodiment, it is not intended to limit the present invention. Those skilled in the art without departing from the scope of the present invention may make various changes or modifications, and thus the scope of the present invention should be after the appended claims and their equivalents.

What is claimed is:

1. A display panel, comprising:
  a light-emitting layer comprising a plurality of pixel units and a plurality of isolating units disposed among the pixel units;
  an encapsulation layer covering the light-emitting layer; and a touch layer comprising at least an insulating dielectric layer covering the encapsulation layer, and a plurality of touch units disposed in the insulating dielectric layer, wherein the plurality of touch units are disposed over the isolating units;

wherein the touch layer further comprises a plurality of recessed portions disposed on the insulting dielectric layer and corresponding to the plurality of pixel units.

2. The display panel of claim 1, wherein each of the touch units is projected on the light-emitting layer at positions corresponding to the isolating units, and each of the recessed portions is disposed on a corresponding one of the pixel units.

3. The display panel of claim 2, wherein each of the recessed portions has a trapezoidal cross section in a direction perpendicular to a surface of the display panel from which light is emitted, wherein a side of the trapezoidal cross section adjacent to the light-emitting layer has a length less than that of another side of the trapezoidal cross section away from the light-emitting layer.

4. The display panel of claim 3, wherein a juncture of each of the recessed portions and the insulating dielectric layer is configured with a smooth mirror surface structure.

5. The display panel of claim 1, wherein the touch layer comprises:
a first insulating dielectric layer disposed on the encapsulation layer;
a first metal layer disposed on the first insulating dielectric layer;
a second insulating dielectric layer covering the first metal layer and the first insulating dielectric layer;
a second metal layer disposed on the second insulting dielectric layer and electrically connected to the first metal layer through a plurality of via holes; and
a third insulating dielectric layer covering the second metal layer and the second insulating dielectric layer.

6. The display panel of claim 5, wherein the second metal layer is configured with a plurality of hollow annular structures or a plurality of frame structures, wherein each of the annular structures or the frame structures has a metal portion disposed over the isolating units, and each of the annular structures or the frame structures has a hollow portion disposed over the pixel units.

7. The display panel of claim 6, wherein the first metal layer comprises a plurality of metal strips, and each of the metal strips is disposed below adjacent two of the annular structures or the frame structures corresponding to the metal strip, and is electrically connected to the annular structures or the frame structures through the via holes.

8. The display panel of claim 6, wherein each of the recessed portions passes through the first insulating dielectric layer, the second insulating dielectric layer, and the third insulating dielectric layer, and exposes a surface of the encapsulation layer.

9. The display panel of claim 6, wherein each of the recessed portions has a first opening passing through the first insulating dielectric layer and the second insulating dielectric layer, wherein the first opening exposes a surface of the encapsulation layer, and the third insulating dielectric layer covers the first opening.

10. An electronic device, comprising a display panel, wherein the display panel comprises:
a light-emitting layer comprising a plurality of pixel units and a plurality of isolating units disposed among the pixel units;
an encapsulation layer covering the light-emitting layer; and
a touch layer comprising at least an insulating dielectric layer covering the encapsulation layer, and a plurality of touch units disposed in the insulating dielectric layer, wherein the plurality of touch units are disposed over the isolating units;

wherein the touch layer further comprises a plurality of recessed portions disposed on the insulting dielectric layer and corresponding to the plurality of pixel units.

11. The electronic device of claim 10, wherein each of the touch units is projected on the light-emitting layer at positions corresponding to the isolating units, and each of the recessed portions is disposed on a corresponding one of the pixel units.

12. The electronic device of claim 11, wherein each of the recessed portions has a trapezoidal cross section in a direction perpendicular to a surface of the display panel from which light is emitted, wherein a side of the trapezoidal cross section adjacent to the light-emitting layer has a length less than that of another side of the trapezoidal cross section away from the light-emitting layer.

13. The electronic device of claim 12, wherein a juncture of each of the recessed portions and the insulating dielectric layer is configured with a smooth mirror surface structure.

14. The electronic device of claim 10, wherein the touch layer comprises:
a first insulating dielectric layer disposed on the encapsulation layer;
a first metal layer disposed on the first insulating dielectric layer;
a second insulating dielectric layer covering the first metal layer and the first insulating dielectric layer;
a second metal layer disposed on the second insulting dielectric layer and electrically connected to the first metal layer through a plurality of via holes; and
a third insulating dielectric layer covering the second metal layer and the second insulating dielectric layer.

15. The electronic device of claim 14, wherein the second metal layer is configured with a plurality of hollow annular structures or a plurality of frame structures, wherein each of the annular structures or the frame structures has a metal portion disposed over the isolating units, and each of the annular structures or the frame structures has a hollow portion disposed over the pixel units.

16. The electronic device of claim 15, wherein the first metal layer comprises a plurality of metal strips, and each of the metal strips is disposed below adjacent two of the annular structures or the frame structures corresponding to the metal strip, and is electrically connected to the annular structures or the frame structures through the via holes.

17. The electronic device of claim 15, wherein each of the recessed portions passes through the first insulating dielectric layer, the second insulating dielectric layer, and the third insulating dielectric layer, and exposes a surface of the encapsulation layer.

18. The electronic device of claim 15, wherein each of the recessed portions has a first opening passing through the first insulating dielectric layer and the second insulating dielectric layer, wherein the first opening exposes a surface of the encapsulation layer, and the third insulating dielectric layer covers the first opening.

* * * * *